(12) United States Patent
Danno (10) Patent No.: US 7,732,910 B2
(45) Date of Patent: Jun. 8, 2010

(54) LEAD FRAME INCLUDING SUSPENDING LEADS HAVING TRENCHES FORMED THEREIN

(75) Inventor: Tadatoshi Danno, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 448 days.

(21) Appl. No.: 11/730,682

(22) Filed: Apr. 3, 2007

(65) Prior Publication Data

US 2007/0181985 A1 Aug. 9, 2007

Related U.S. Application Data

(63) Continuation of application No. 11/117,481, filed on Apr. 29, 2005, now Pat. No. 7,220,607.

(30) Foreign Application Priority Data

Apr. 30, 2004 (JP) .............................. 2004-135259

(51) Int. Cl.
*H01L 23/52* (2006.01)
(52) U.S. Cl. ..................................... 257/692
(58) Field of Classification Search ........................ None
See application file for complete search history.

(56) References Cited

U.S. PATENT DOCUMENTS

| | | | |
|---|---|---|---|
| 5,665,651 A * | 9/1997 | Asada et al. ................... 29/827 |
| 6,563,209 B1 * | 5/2003 | Takahashi .................... 257/692 |
| 7,112,471 B2 | 9/2006 | Boon et al. |
| 2001/0022396 A1 * | 9/2001 | Distefano et al. ........... 257/723 |
| 2001/0032985 A1 | 10/2001 | Bhat et al. |
| 2002/0001869 A1 | 1/2002 | Fjelstad |
| 2002/0123163 A1 | 9/2002 | Fujii |
| 2002/0173076 A1 * | 11/2002 | Michii et al. ................. 438/111 |
| 2003/0209815 A1 * | 11/2003 | Ito et al. ...................... 257/797 |
| 2005/0284578 A1 | 12/2005 | Uchida et al. |

FOREIGN PATENT DOCUMENTS

JP 2005-151625 5/2002

\* cited by examiner

*Primary Examiner*—Charles D Garber
*Assistant Examiner*—Andre' C Stevenson
(74) *Attorney, Agent, or Firm*—Antonelli, Terry, Stout & Kraus, LLP.

(57) ABSTRACT

In a lead frame, through holes are formed outside suspending leads and trenches are formed on a back surface along the suspending leads so as to communicate with the through holes. When sealing resin is injected into cavities of a resin molding die, air enters the through holes through air vents and flows out from the through holes by a resin injection pressure in the trenches, making it easier for the sealing resin to enter the through holes. Since the sealing resin leaking to the air vents can be injected into the through holes, it is possible to enhance the bonding force between the sealing resin after curing and the lead frame in the vicinity of the air vents and effect release of the resin molding die, while allowing the sealing resin leaking to the air vents to remain on the lead frame side without remaining within the air vents.

6 Claims, 10 Drawing Sheets

LEAD FRAME INCLUDING SUSPENDING LEADS HAVING TRENCHES FORMED THEREIN

CROSS-REFERENCE TO RELATED APPLICATIONS

This application is a continuation application of U.S. application Ser. No. 11/117,481, filed Apr. 29, 2005, now U.S. Pat. No. 7,220,607 and which application claims priority from Japanese patent application No. 2004-135259, filed on Apr. 30, 2004, the contents of which are hereby incorporated by reference into this application.

BACKGROUND OF THE INVENTION

The present invention relates in general to a method of manufacturing a semiconductor device and a lead frame. Particularly, the present invention is concerned with a technique which is effective for decreasing the cleaning frequency of a resin molding die.

According to a conventional method of manufacturing a semiconductor device, a matrix lead frame is provided, which has a plurality of unit lead frame patterns arranged longitudinally and transversely in a lattice shape; then, semiconductor chips are fixed and electrodes of the semiconductor chips and inner ends of leads are connected together using wires; and, thereafter, the semiconductor chips, wires and lead inner ends are covered with a sealing body (package) by one-side molding. In this case, a contact preventing member that is thicker than the package is formed outside the package with the use of injected resin (see, for example, Patent Literature 1).

[Patent Literature]
Japanese Unexamined Patent Publication No. 2002-151625 (FIG. 1)

SUMMARY OF THE INVENTION

In a non-leaded semiconductor device, such as a QFN (Quad Flat Non-leaded Package), leads are partially exposed to the outer edge portions on a back surface, thereby serving as external terminals.

Therefore, in a resin sealing process as used in assembling such a QFN, a sealing sheet is disposed on one die surface (e.g., a surface of a lower die) of a resin molding die in such a manner that the leads are sure to be exposed to a back surface of a sealing body; and, then, a lead frame is disposed on the sealing sheet, and resin molding is performed in a state in which the leads are in close contact with the sealing sheet, whereby the leads are exposed to the back surface of the sealing body, while preventing the sealing resin from adhering to a part of each lead.

According to such a resin sealing method, at the time of forming air vents in the resin molding die, since the sealing sheet is disposed on one die surface, the air vents can be formed on only the other die surface on which the sealing sheet is not disposed.

In the lead frame, through holes are formed outside suspending leads and in positions corresponding to the air vents of the resin molding die, and the sealing resin leaking to the air vents is allowed to enter the through holes and harden, whereby, at the time of mold release, the sealing resin present within the air vents is allowed to remain on the lead frame side, lest the sealing resin should remain within the air vents of the resin molding die.

In resin sealing for a QFN, when sealing resin is injected into a cavity of the resin molding die, the air present within the cavity flows through the air vents into the through holes formed outside the suspending leads. However, since one of the openings of the through holes is closed by the sealing sheet, the air stays within the through holes, and, hence, a phenomenon occurs in which the sealing resin leaking into the air vents does not enter the through holes or side-steps the through holes.

As a result, after mold release, the sealing resin remains on the die side, causing clogging of the air vents or incomplete filling of resin.

Moreover, since the sealing resin remains on the die side, the cleaning frequency for the resin molding die increases, thus giving rise to the problem that the throughput in the resin sealing process in assembling a QFN becomes lower.

It also has been proposed to use a method wherein resin sealing is performed without using the sealing sheet in assembling a QFN. In this case, however, since the sealing resin adheres to the surface to be exposed of each lead, a process for removing the sealing resin that has adhered to each lead on the back surface of the sealing body is needed after the resin sealing process, thus causing the problem that the productivity in assembling a QFN is deteriorated.

In paragraph [0068] of the foregoing Patent Literature 1, it is indicated that resin cured in air vents is allowed to bite into holes formed in a lead frame to prevent the cured resin in the air vents from falling off. In the resin sealing process which adopts the use of a sealing sheet for a QFN, air stays within the holes and the sealing resin does not enter the holes, so that it is presumed to be impossible to prevent fall-off of the resin that has cured in the air vents.

It is an object of the present invention to provide a method of manufacturing a semiconductor device which can reduce the cleaning frequency for a resin molding die, as well as a lead frame used for the method.

It is another object of the present invention to provide a method of manufacturing a semiconductor device which can improve the throughput of assembly, as well as a lead frame used for the method.

It is a further object of the present invention to provide a method of manufacturing a semiconductor device which can improve the quality of a product, as well as a lead frame used for the method.

The above and other objects and novel features of the present invention will become apparent from the following description and the accompanying drawings.

Typical modes of the present invention as disclosed herein will be outlined below.

In one aspect of the present invention, there is a method of manufacturing a semiconductor device, which has a lead frame, the lead frame having chip mounting portions, suspending leads connected to each of the chip mounting portions, a plurality of leads arranged around each of the chip mounting portions, through holes formed outside the suspending leads in extending directions of the suspending leads, and trenches formed along the suspending leads on a back surface side opposite to the chip mounting portion side so as to communicate with the through holes; the method comprising the steps of mounting semiconductor chips respectively onto the chip mounting portions; connecting electrodes of the semiconductor chips and the leads with each other through electrically conductive wires; disposing the lead frame onto a die surface of a resin molding die, thereafter aligning the air vents formed in the resin molding die and the through holes and trenches formed in the lead frame so as to correspond to each other, clamping the resin molding die, then injecting sealing resin into cavities of the resin molding die, allowing air which has entered the through holes through the air vents and the trenches to flow out from the through holes by virtue of an influent pressure of the sealing resin, and performing resin sealing so that the sealing resin is injected into the cavities and the through holes; after the resin sealing, allowing the sealing resin to remain in the through holes of the lead frame without allowing it to remain in the air vents, and releasing the resin molding die; and separating the leads and the suspending leads from the lead frame to divide the lead frame into individual chip mounting portions.

In another aspect of the present invention, there is a method of manufacturing a semiconductor device, which has a lead frame, the lead frame having a plurality of device regions, the device regions each having a chip mounting portion, suspending leads connected to the chip mounting portion, and a plurality of leads arranged around the chip mounting portion, the lead frame further having through holes formed outside the suspending leads in extending directions of the suspending leads, the through holes each disposed in an elongated shape along an extending direction of a gate runner in an adjacent device region when a resin molding die is clamped; the method comprising the steps of mounting semiconductor chips respectively onto the chip mounting portions; connecting electrodes of the semiconductor chips and the leads with each other through electrically conductive wires; disposing the lead frame onto a die surface of the resin molding die, thereafter aligning the air vents formed in the resin molding die and the through holes formed in the lead frame so as to correspond to each other, clamping the resin molding die, then injecting sealing resin into cavities of the resin molding die through respective gate runners, allowing air present within the through holes to flow out from the through holes by virtue of an influent pressure of the sealing resin, and performing resin sealing so that the sealing resin is filled into the cavities and the through holes; after the resin sealing, allowing the sealing resin to remain in the through holes of the lead frame and releasing the resin molding die; and separating the leads and the suspending leads from the lead frame to divide the lead frame into individual device regions.

In a further aspect of the present invention, there is a lead frame comprising chip mounting portions capable of mounting semiconductor chips respectively thereon, suspending leads connected to each of the chip mounting portions, a plurality of leads arranged around each of the chip mounting portions, and frame portions connected to the suspending leads and the leads, the frame portions having through holes formed outside the suspending leads in extending directions of the suspending leads and trenches formed so as to communicate with the through holes along the suspending leads on a back surface side opposite to the chip mounting portion side.

The following is a brief description of effects obtained by typical modes of the present invention as disclosed herein.

Since through holes are formed outside the suspending leads in the lead frame and trenches are formed on the back surface side so as to communicate with the through holes along the suspending leads, air which has entered the through holes through the air vents and the trenches can be allowed to flow out from the through holes by virtue of an influent pressure at the time of injection of sealing resin into the cavities. As a result, the sealing resin can be filled into the through holes. Consequently, it is possible to enhance the bonding force between the sealing resin after curing and the lead frame in the vicinity of the air vents, and, at the time of release of the resin molding die, it is possible to release the die while allowing the sealing resin present within the air vents to remain on the lead frame side. Thus, it is possible to prevent clogging of the air vents in the resin molding die and, thereby, to decrease the cleaning frequency for the die.

DETAILED DESCRIPTION OF THE PREFERRED EMBODIMENTS

In the following description of the embodiments, as to the same or similar portions, repeated explanations thereof will be omitted in principle except where required.

Where required for convenience's sake, the subject matter of the present invention will be described in a divided manner as plural sections or embodiments, but unless otherwise mentioned, they are not unrelated to each other, but are in a relation such that one is a modification, a detailed description or a supplementary explanation of part or the whole of the other.

In the following description of the embodiments, when reference is made to a number of elements (including the number, numerical value, quantity, and range), no limitation is made to the number referred to, but numerals above and below the number referred to will do as well, unless otherwise mentioned and except for the case where it is basically evident that a limitation is made to the number referred to.

The embodiments of the present invention will be described in detail hereinunder with reference to the accompanying drawings. In all of the drawings, constituent members having the same functions are identified by the same reference numerals, and repeated explanations thereof will be omitted in the following description.

Embodiments

A semiconductor device according to an embodiment of the present invention, as illustrated in FIGS. 1 to 4, is a small-sized non-leaded type device, wherein plural leads 1a are arranged side by side on outer edge portions of a back surface 3a of a sealing body 3 in such a manner that each of the leads 1a is partially exposed. In the description of this embodiment, reference will be made below to a QFN 5 as an example of the semiconductor device.

Figure 1:
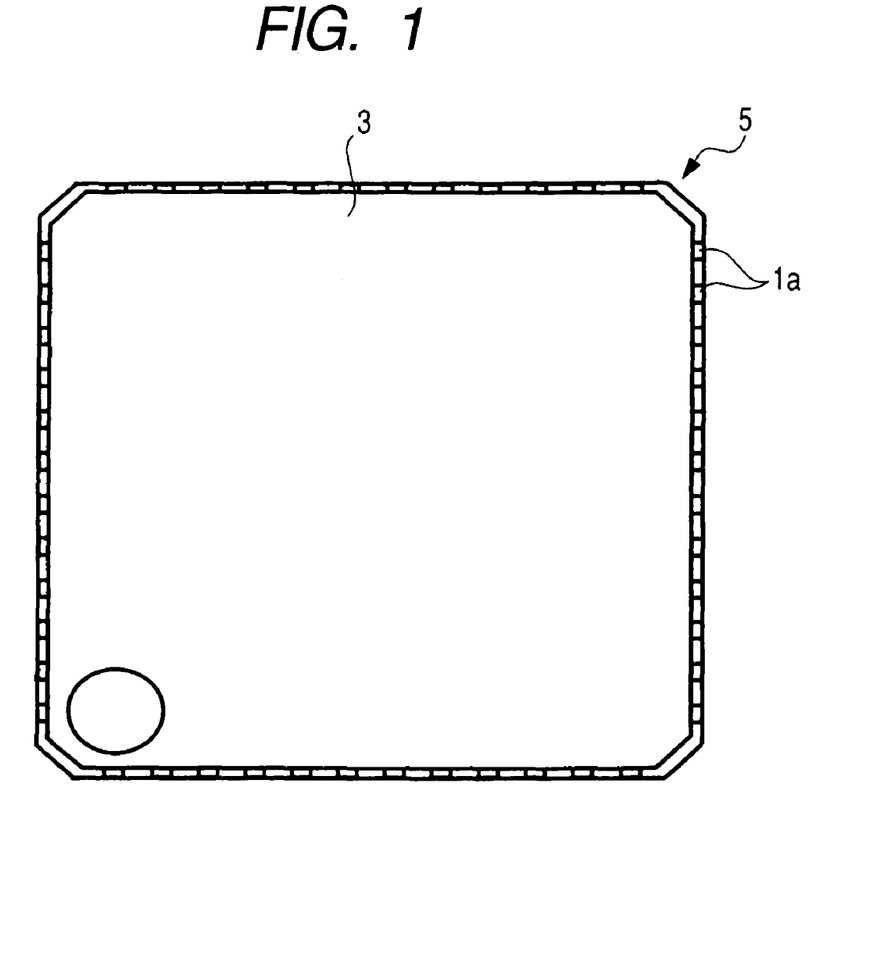
FIG. 1 is a plan view showing an example of the structure of a semiconductor device assembled by a semiconductor device manufacturing method according to an embodiment of the present invention.
Figure 2:
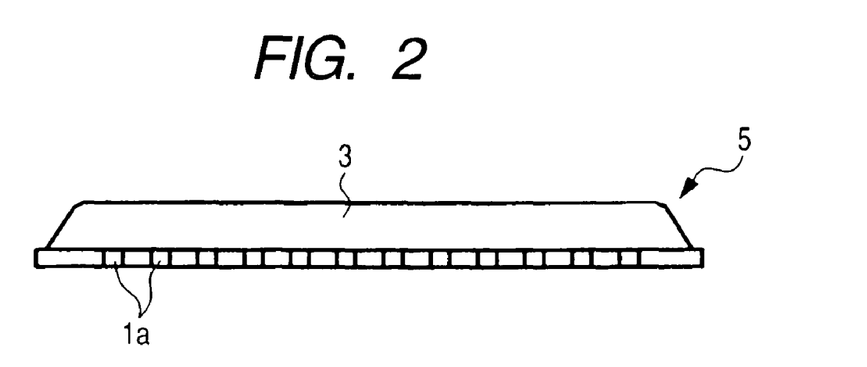
FIG. 2 is a side view thereof.
Figure 3:
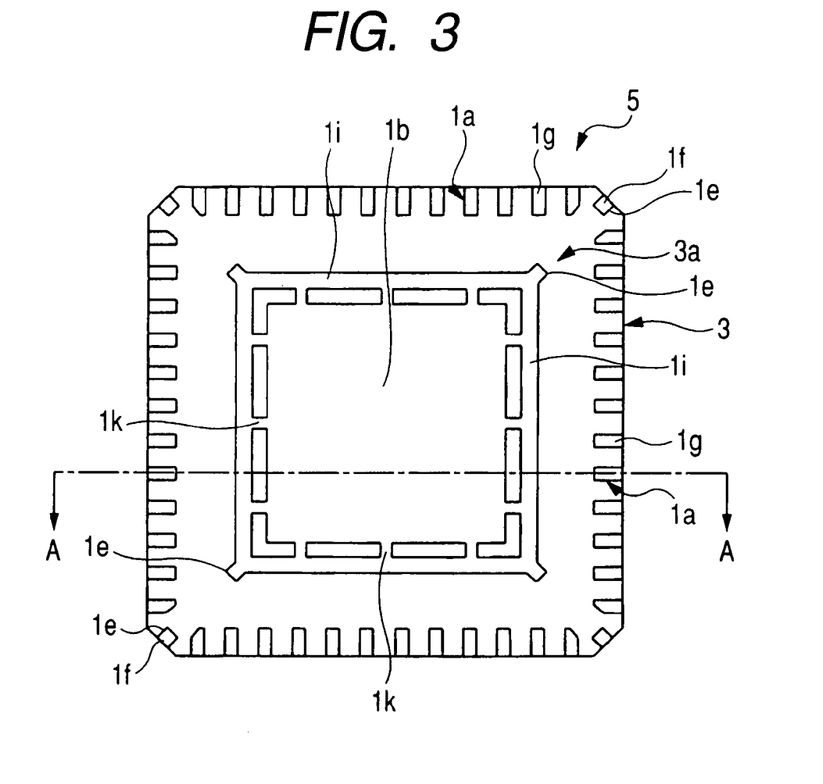
FIG. 3 is a back view thereof.
Figure 4:
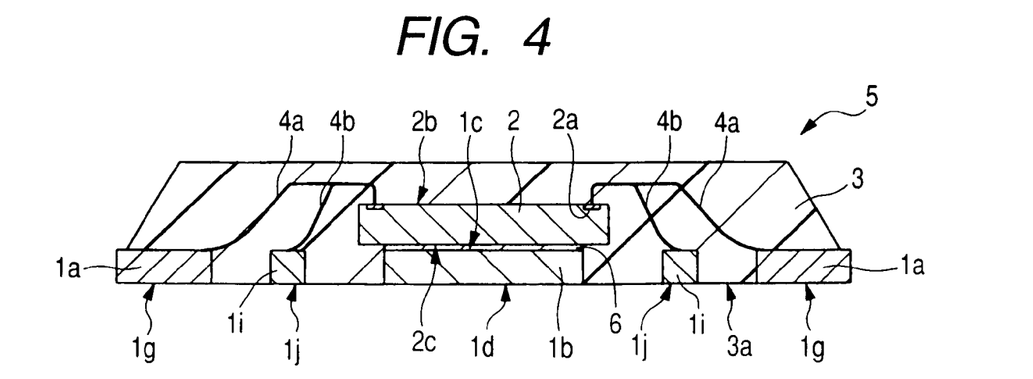
FIG. 4 is a structural sectional view taken along the line A-A in FIG. 3.

A description will now be given as to the construction of the QFN 5. As shown in FIG. 4, the QFN 5 comprises a semiconductor chip 2 having, on a main surface 2b thereof, a semiconductor element and plural pads (electrodes) 2a; a tab 1b serving as a chip mounting portion connected to the semiconductor chip 2; bus bars 1i which are disposed outside the semiconductor chip 2 and are connected to the tab 1b through connecting portions 1k, as shown in FIG. 3; a sealing body 3 which seals the semiconductor chip 2 with resin; plural leads 1a which are arranged around the semiconductor chip 2 so that respective to-be-connected surfaces (portions) 1g are exposed at outer edge portions of a back surface 3a of the sealing body 3, suspending leads 1e which are arranged respectively at positions corresponding to the four corners of the sealing body 3 and are connected to the tab 1b; plural first wires 4a which connect the plural pads 2a of the semiconductor chip 2 and corresponding plural leads 1a with each other, as shown in FIG. 4; and plural second wires 4b which connect predetermined pads 2a of the semiconductor chip 2 and the bus bars 1i with each other.

In the QFN 5 of this embodiment, the bus bars 1i are arranged around the semiconductor chip 2, and predetermined plural pads 2a, such as ground (GND) or power-supply pads 2a, are connected to the bus bars 1i through the is second wires 4b by down bonding. In this way, the leads 1a are used in common to reduce the number of input/output pins and thereby attain a further reduction of the size of the device.

The bus bars 1i are arranged around the tab 1b as a chip mounting portion through a gap, and both ends thereof are connected to the suspending leads 1e. The bus bars 1i are arranged outside the semiconductor chip 2 so that they can be wire-bonded to the semiconductor chip.

Not only the to-be-connected surfaces 1g of the leads 1a, but also a back surface 1d of the tab 1b, back surfaces 1j of the bus bars 1i and back surfaces 1f of the suspending leads 1e are each partially exposed to the back surface 3a of the sealing body 3.

It is preferable that the pads 2a of the semiconductor chip 2, which are connected to the bus bars 1i through the second wires 4b, be ground or power-supply electrodes capable of serving as common pins. For example, when a bus bar 1i is connected to a ground pad 2a, a ground potential is applied to the bus bar 1i.

As shown in FIG. 4, the semiconductor chip 2 is fixed onto a main surface 1c of the tab 1b with use of, for example, a die bonding material (e.g., silver paste) 6, whereby a back surface 2c of the semiconductor chip 2 and the main surface 1c of the tab 1b are connected together through the die bonding material 6.

Plural leads 1a, which are arranged side by side on the outer edge portions of the back surface 3a of the sealing body 3 in the QFN 5, are respectively exposed partially as to-be-connected surfaces 1g on the back surface 3a of the sealing body 3. The to-be-connected surfaces 1g are exteriorly plated with solder or palladium.

The tab 1b, suspending leads 1e and leads 1a are formed using a copper alloy sheet, for example. The first wires 4a for connecting pads 2a of the semiconductor chip 2 and corresponding leads 1a, as well as the second wires 4b for connecting ground pads 2a of the semiconductor chip 2 and bus bars 1i, are gold wires, for example. The sealing body 3 is formed by resin sealing in accordance with a molding method. The sealing resin used in this molding method is, for example, a thermosetting epoxy resin.

Next, the method of manufacturing the QFN 5 (semiconductor device) of this embodiment will be described below with reference to the manufacturing process flowchart of FIG. 5.

Figure 6:
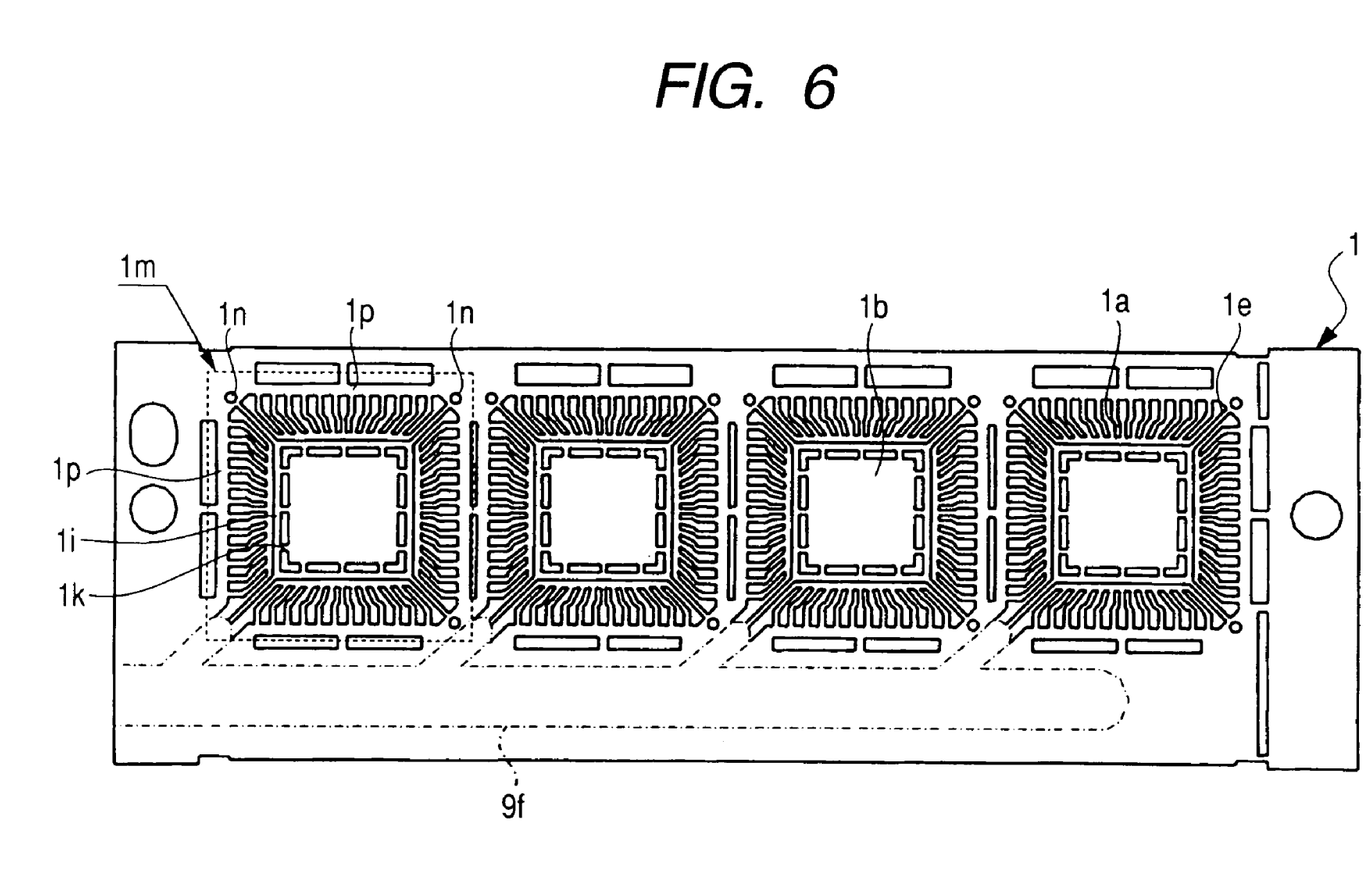
FIG. 6 is a plan view showing an example of the structure of a lead frame used in assembling the semiconductor device illustrated in FIG. 1.
Figure 7:
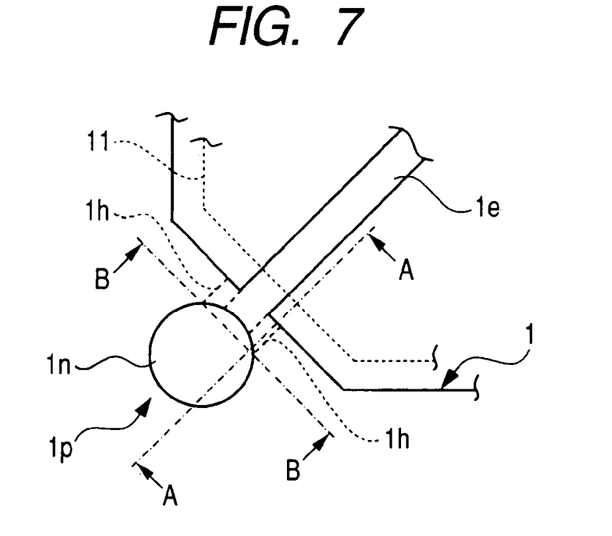
FIG. 7 is an enlarged plan view showing an example of the structure of a corner portion of a device region in the lead frame of FIG. 6.

First, a lead frame 1, as shown in FIG. 6, is provided in step S1. The lead frame 1 includes a tab 1b capable of carrying the semiconductor chip 2 thereon, suspending leads 1e connected to the tab 1b, plural leads 1a arranged around the tab 1b, and bus bars 1i connected to the tab 1b through connecting portions 1k and arranged outside the tab 1b. As shown in FIG. 7, the lead frame 1, which is shown in its entirety in FIG. 6, further includes through holes 1n formed outside the suspending leads 1e in the directions of extension of the suspending leads 1e, and trenches 1h (first trenches) are formed on a back surface side opposite to the chip mounting side so as to communicate with the through holes 1n along the leads 1e.

Figure 8:
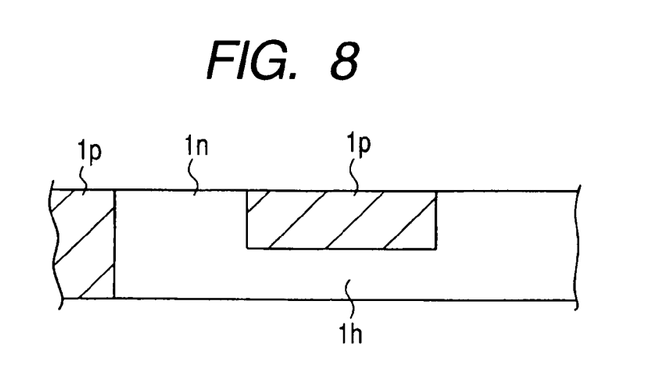
FIG. 8 is a sectional view taken along the line A-A in FIG. 7.
Figure 9:
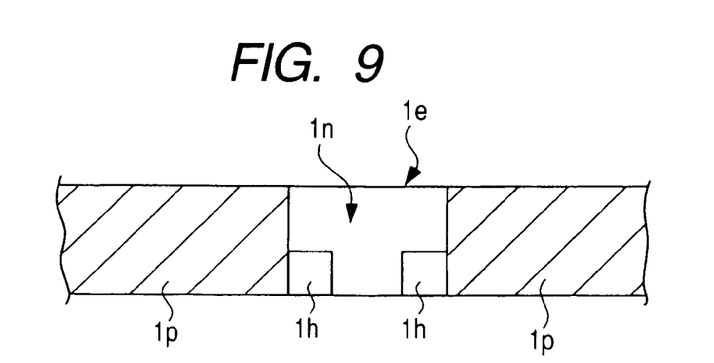
FIG. 9 is a sectional view taken along the line B-B in FIG. 7.

More specifically, in each of the device regions 1m formed on the lead frame 1, a circular through hole 1n is formed in an outer frame portion 1p at a position outside each suspending lead 1e and in the direction of extension of the suspending lead, as shown in FIG. 7. Further, on a back surface side opposite to the chip mounting side of the frame portion 1p, trenches 1h, as shown in FIGS. 8 and 9, are formed along and on both sides of the suspending lead 1e so as to communicate with the through hole 1n from the suspending lead side.

Figure 12:
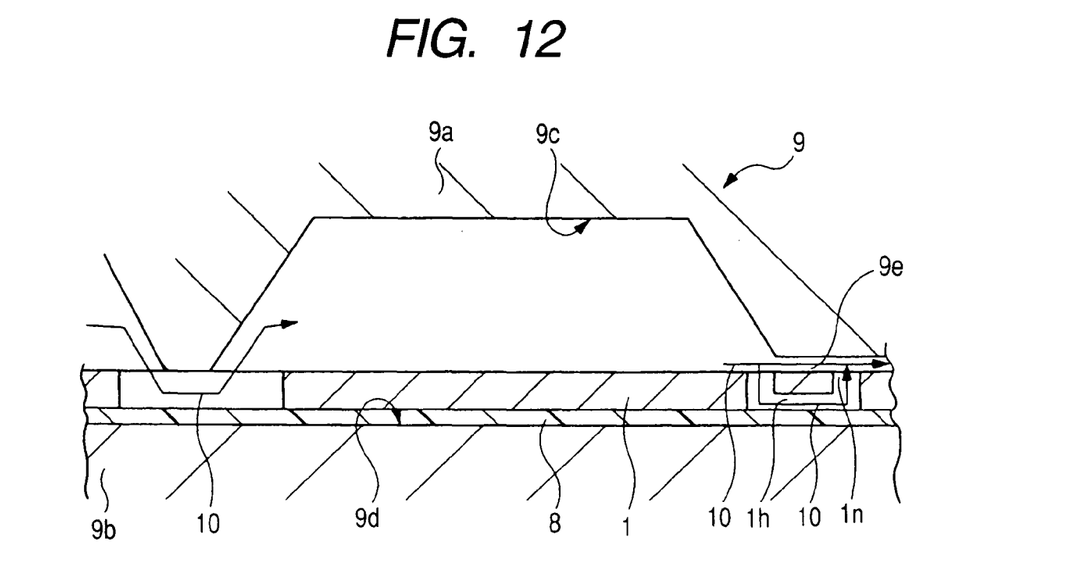
FIG. 12 is a sectional view showing an example of the resin flow in a state in which resin is injected in the resin sealing process during assembly of the semiconductor device illustrated in FIG. 1.
Figure 13:
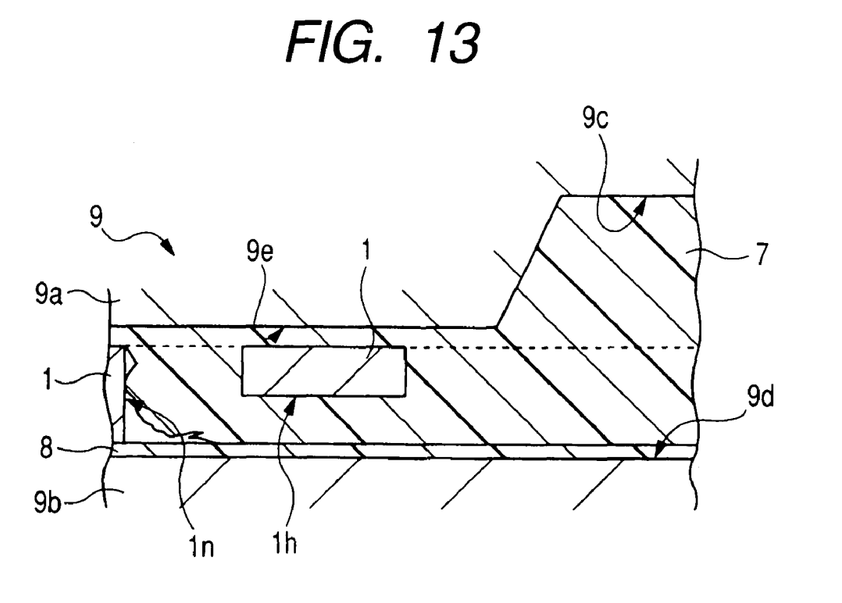
FIG. 13 is a sectional view taken along the line A-A in FIG. 7, showing the structure after resin fill.

When sealing resin 7 is injected into a cavity 9c of a resin molding die 9 in a resin sealing process, as shown in FIGS. 12 and 13, the sealing resin passing through an air vent 9e is allowed to get into the through hole 1n and is cured therein, and then the sealing resin 7 remaining within the air vent 9e is allowed to adhere to and remain on the lead frame 1 side at the time of releasing the die, leaving little resin within the air vent 9e. The through hole 1n functions in this way. That is, the through hole 1n serves as a resin trap for allowing the sealing resin 7 remaining within the air vent 9e to adhere to the lead frame 1 side at the time of die release.

Therefore, the through hole 1n is formed so as to be located outside the cavity 9c and at a position corresponding to the air vent 9e when clamping the resin mold die 9.

Each trench 1h serves as an air flow outlet path for causing air which has entered the through hole 1n through the air vent 9e and trench 1h with influent pressure of the sealing resin 7 to flow out of the through hole 1n.

In the lead frame 1 thus constructed, at the time of injecting resin into the cavity 9c, a portion of the air extruded by an injection pressure at first gets into the through hole 1n; and, thereafter, since resin is injected also from the trench 1h, the air is extruded to the exterior of the through hole 1n by an injection pressure exerted thereon from the trench 1h side. As a result, air does not stay within the through hole 1n, and, therefore, it is possible to facilitate entry of the sealing resin 7 into the through hole 1n.

For example, the trench 1h is formed by half etching or stamping.

As shown in FIG. 6, the lead frame 1 is a strip-like frame member on which plural device regions 1m are formed continuously, each of the device regions 1m comprising a tab 1b, plural leads 1a arranged around the tab 1b, suspending leads 1e connected to the tab 1b, bus bars 1i connected to the tab 1b through connecting portions 1k, and frame portions 1p which surround those components. For example, the lead frame 1 is formed of a copper alloy.

In the QFN 5, in the case where the exterior of the to-be-connected surface 1g of each lead 1a is plated with palladium, the lead frame 1 is plated beforehand with palladium throughout the whole surface thereof.

Figure 5:
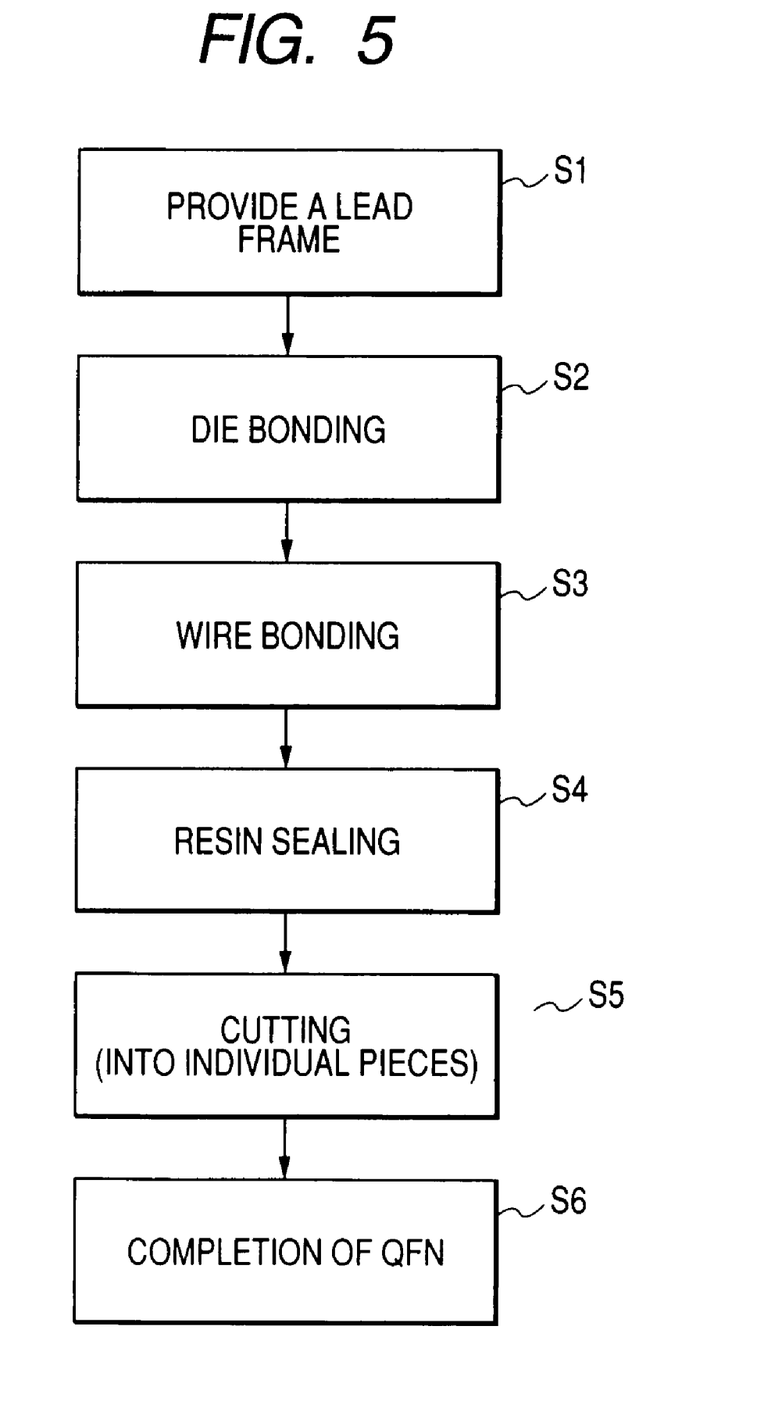
FIG. 5 is a manufacturing flowchart showing an example of the procedure used for assembling the semiconductor device illustrated in FIG. 1.

Thereafter, die bonding is performed in step S2 shown in FIG. 5. In this step, a semiconductor chip 2 is fixed onto the main surface 1c of each tab 1b, which serves as a chip mounting portion on the lead frame 1, through a die bonding material 6, for example.

Subsequently, wire bonding is performed in step S3. In this step, as shown in FIG. 4, pads 2a on the semiconductor chip 2 and corresponding leads 1a are connected together through electrically conductive first wires 4a, such as gold wires. Further, pads 2a for ground (or for power supply) on the semiconductor chip 2 and bus bars 1i are connected together through electrically conductive second wires 4b, such as gold wires.

Then, resin sealing (resin molding) is performed in step S4. According to a resin sealing method adopted in this embodiment, the individual device regions 1m of the lead frame 1 are covered respectively with cavities 9c of an upper die 9a of the resin molding die 9, and the sealing resin 7 is injected into the cavities 9c.

Figure 10:
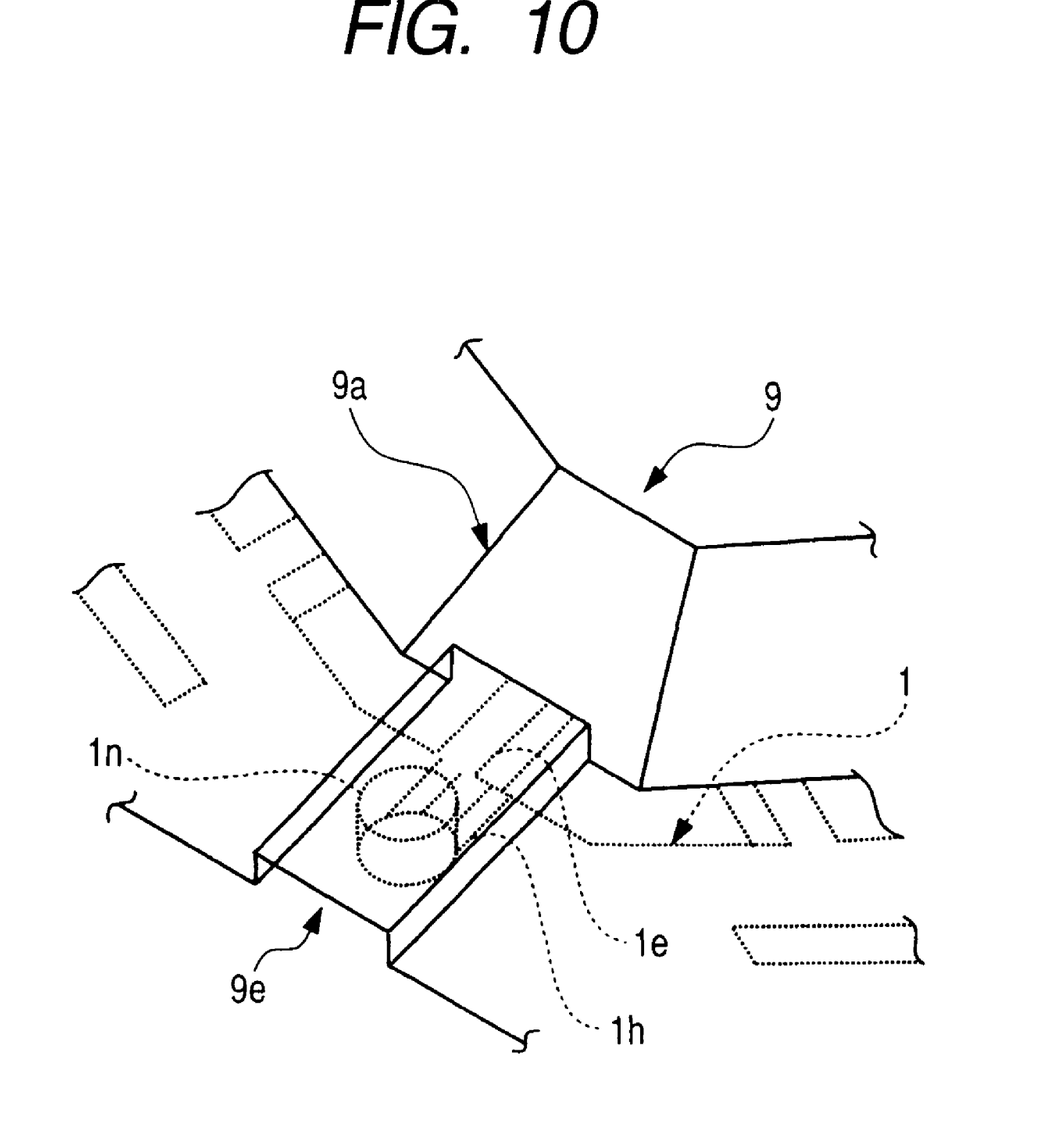
FIG. 10 is a perspective view showing an example of the structure of a die corner portion in a state in which a die is clamped in a resin sealing process during assembly of the semiconductor device illustrated in FIG. 1.
Figure 11:
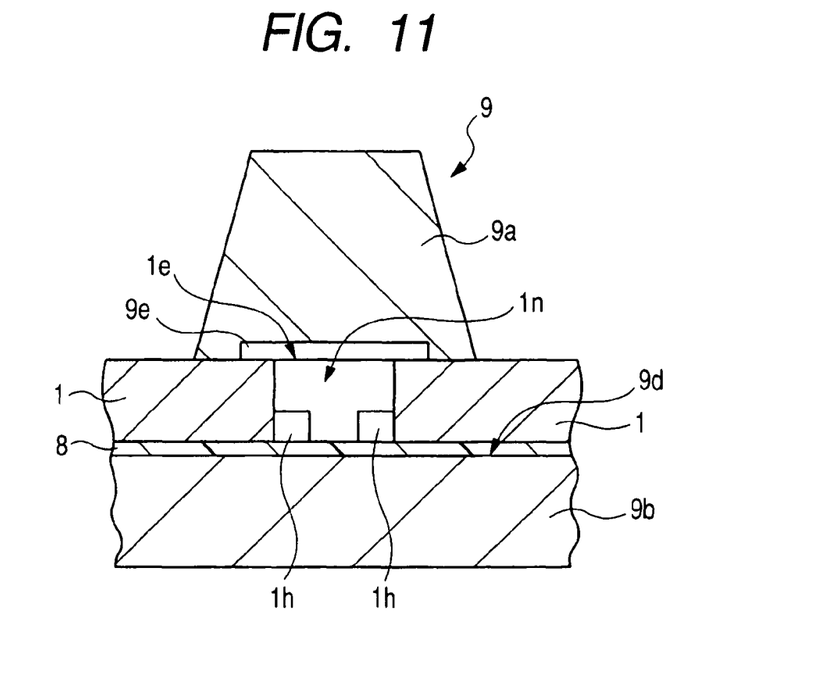
FIG. 11 is an enlarged sectional view showing the structure of the die corner portion in the die clamping illustrated in FIG. 10.

First, as shown in FIG. 12, the lead frame 1 is disposed onto a die surface 9d of a lower die 9b of the resin molding die 9 so as to be placed on a film sheet 8, which is a sealing sheet disposed on the die surface 9d of the lower die 9b. Thereafter, as shown in FIGS. 10 and 11, air vents 9e formed in the resin molding die 9 and the through holes 1n and trenches 1h formed in the lead frame 1 are positioned to correspond to each other, and clamping of the resin molding die 9 is performed so that the leads 1a of the lead frame 1 come into close contact with the film sheet 8. That is, the die clamping is performed in a state in which the through holes 1n and trenches 1h of the lead frame 1 are positioned below the air vents 9e formed in the upper die 9a of the resin molding die 9.

After the die clamping, the sealing resin 7 is injected into the cavities 9c of the resin molding die 9 to form a resin flow 10, as shown in FIG. 12, and air present within each cavity 9c is extruded into each air vent 9e by virtue of an influent pressure of the sealing resin 7. A portion of the air thus extruded into the air vent 9e flows at first into the through hole 1n, and then it flows out from the through hole 1n by virtue of the resin injection pressure exerted on the air from the trench 1h. That is, the air which has once entered the through hole 1n is extruded from the through hole 1n to the exterior through the air vent 9e and the trench 1h.

Figure 14:
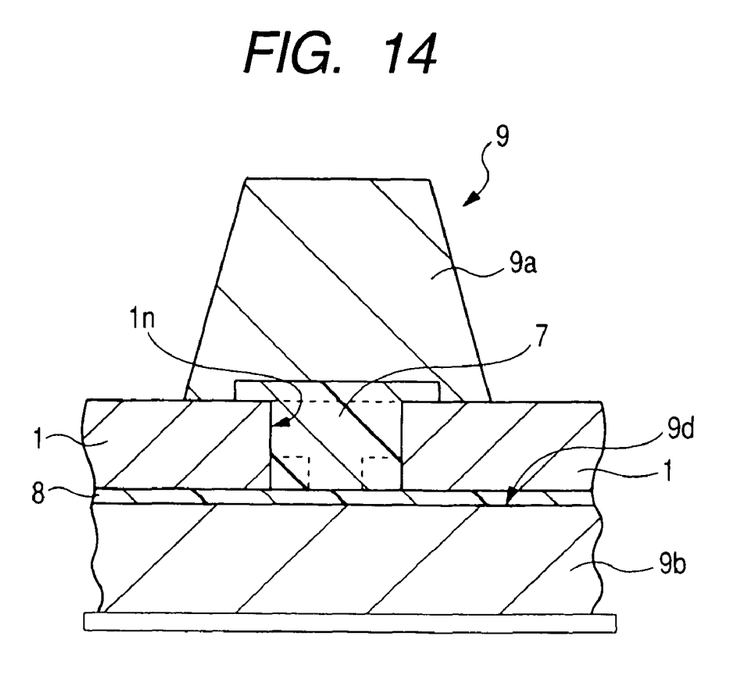
FIG. 14 is a sectional view taken along the line B-B in FIG. 7, showing the structure after resin fill.

Thus, since air does not stay within the through hole 1n, it becomes easier for the sealing resin to get into the through hole 1n. As a result, a portion of the sealing resin 7 leaking into the air vent 9e flows into the through hole 1n, as shown in FIGS. 13 and 14. In this way, the sealing resin 7 is filled into the cavity 9c and the through hole 1n.

After the completion of filling of the sealing resin 7, the sealing resin is cured, and, thereafter, the die is released. That is, the lower die 9b and the upper die 9a are separated from each other. At this time, according to the semiconductor device manufacturing method of this embodiment, a portion of the sealing resin 7 leaking into the air vent 9e is fitted into the through hole 1n in the lead frame 1, and, further, the resin portions flowing out from the air vents 9e and trenches 1h join (engage each other) in the through hole 1n, so that the bonding force between the sealing resin 7 after curing and the lead frame 1 in the vicinity of the air vent 9e can be enhanced. Further, the sealing resin 7 leaking into the air vent 9e is allowed to adhere to and remain on the lead frame 1 side, and, thus, the die can be released in such a manner that the sealing resin 7 scarcely remains within the air vent 9e.

After resin sealing, the leads are cut (division into individual pieces) in step S5, as shown in FIG. 5. In this step, the leads 1a and suspending leads 1e are cut and separated from the frame portions 1p, that is, the lead frame is divided into individual device regions at positions slightly outside of a mold line 11, as shown in FIG. 7. As a result, the QFN is completed in step S6.

According to the semiconductor device manufacturing method of this embodiment and on the basis of the lead frame used therein, through holes 1n are formed outside the suspending leads 1e in the lead frame 1, and trenches 1h communicating with the through holes 1n are formed on the back surface side along the suspending leads 1e, whereby, when injecting the sealing resin 7 into the cavities 9c of the resin molding die 9, air which has entered the through holes 1n by virtue of the influent pressure of the sealing resin 7 in the air vents 9e and trenches 1h can be allowed to flow out from the through holes 1n.

Since air does not stay within the through holes 1n, it becomes easier for the sealing resin 7 to enter the through holes 1n, and the sealing resin 7 leaking to the air vents 9e can be filled into the through holes 1n. As a result, it is possible to enhance the bonding force between the sealing resin 7 after curing and the lead frame 1 in the vicinity of the air vents 9e. The sealing resin 7 leaking to the air vents 9e can be allowed to adhere to and remain on the lead frame 1 side at the time of release of the resin molding die 9, and it is possible to effect the die release while allowing little sealing resin 7 to remain within the air vents 9e on the die side.

Consequently, it is possible to prevent clogging of the air vents in the resin molding die 9, and, hence, it is possible to decrease the cleaning frequency of the resin molding die 9. As a result, it is possible to improve the throughput in the resin sealing process during assembly of the QFN 5.

For example, the cleaning frequency for the resin molding die 9, which has so far been once per lot, can be decreased to about once per 600 shots. Thus, it is possible to not only make the resin sealing work efficient, but also to greatly improve the throughput in the resin sealing work.

Besides, since it is possible to prevent clogging of the air vents in the resin molding die 9, it is possible to decrease the occurrence of non-filling of the sealing resin 7. As a result, it is possible to improve the quality of product (QFN 5).

Thus, at the time of cutting the corners for dividing the lead frame into individual pieces, it is possible to prevent the occurrence of chipping and cracking of the packages, and, hence, it is possible to improve the quality of the product (QFN 5).

The following description is directed to modifications of the above-described embodiment.

Figure 15:
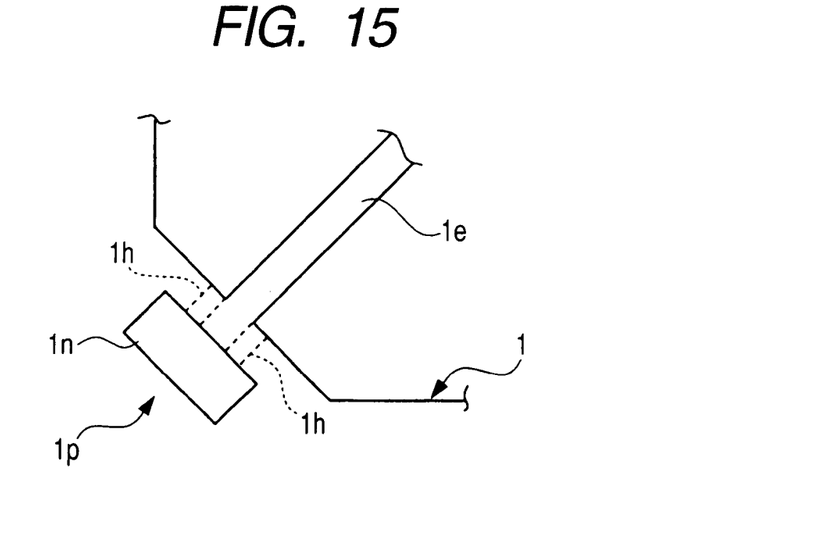
FIG. 15 is an enlarged plan view showing the structure of a corner portion of a device region in a lead frame according to a modification of the embodiment.

In FIG. 15, each of the through holes 1*n* formed in the lead frame 1 is formed to have an elongated rectangular shape. Preferably, the through hole 1*n* is formed so that the length in the longitudinal direction thereof is larger than the width of each air vent 9*e* in the resin molding die 9.

As a result, the through hole 1*n* can surely be positioned below the air vent 9*e* in the upper die 9*a*, and, hence, it becomes easier to fill the sealing resin 7 into the through hole 1*n*. Consequently, it is possible to effect die release while enhancing the bonding force between the sealing resin 7 after curing and the lead frame 1 in the vicinity of the air vents 9*e*.

Figure 16:
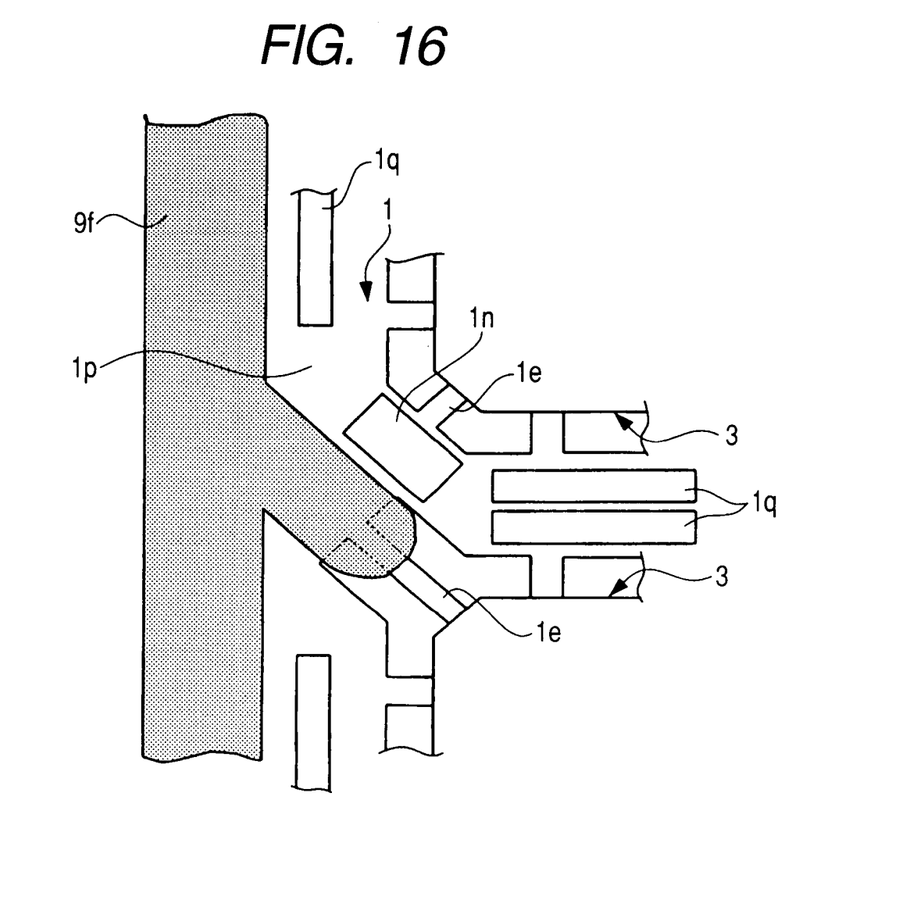
FIG. 16 is an enlarged plan view showing an example of a layout relationship between a through hole and an adjacent gate runner in the lead frame of the modification illustrated in FIG. 15.

From the standpoint that each of the through holes 1*n* is to be formed so as to be sufficiently larger (wider) than the width of each air vent 9*e*, the through hole may be formed in a sufficiently large circular shape. However, since the distance from the gate runner 9*f* in the device region 1*m* adjacent to the through hole 1*n* is very short, the sealing resin 7 flows into the air vent 9*e* from the adjacent device region 1*m*. Therefore, in the case of forming the through hole 1*n* to have an elongated rectangular shape, as shown in FIG. 16, it is preferable that the through hole 1*n* be formed in so as to extend along the direction of the gate runner 9*f*, which is disposed in the adjacent device region 1*m* (see FIG. 6) in proximity to the through hole 1*n*. As a result, even in the case where the gate runner 9*f* in the adjacent device region 1*m* is close to the through hole 1*n*, the length in the longitudinal direction of the rectangular through hole 1*n* can be made sufficiently larger than the width of the air vent 9*e*.

However, by use only of the features of this embodiment (modification), wherein the trench 1*n* communicating with the through hole 1*n* is not formed, it is impossible to completely remove the air staying within the through hole 1*n*, and, hence, there is a fear that the sealing resin 7 may flow along the upper portion (upper die side) of the air vent 9*e*.

Although the through hole 1*n* used in this embodiment (modification) is rectangular in shape, the through hole 1*n* may be, for example, elliptic in shape so long as it is sufficiently longer than the width of the air vent 9*e* and does not come into contact with the gate runner 9*f* in the adjacent device region 1*m*.

Figure 17:
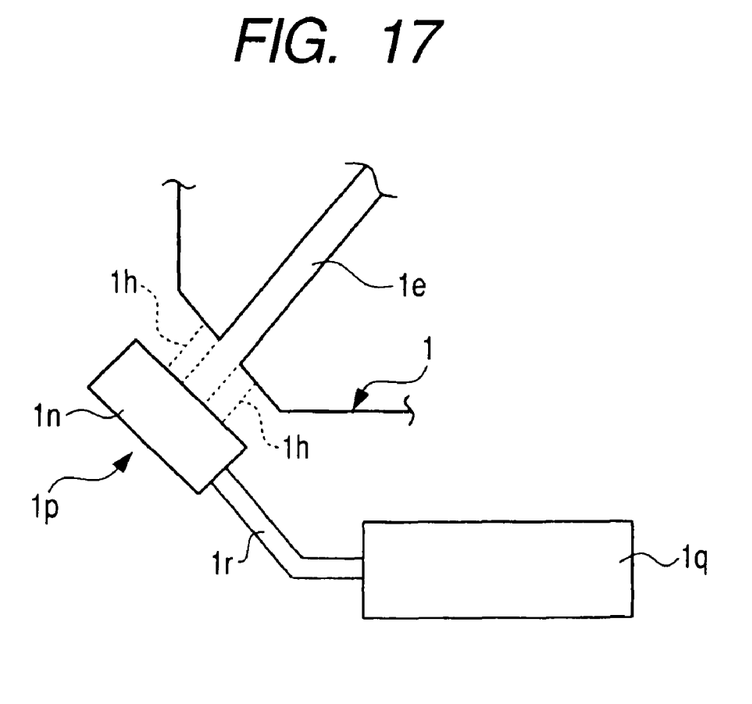
FIG. 17 is an enlarged plan view showing the structure of a corner portion of a device region in a lead frame according to another modification of the embodiment.

FIG. 17 shows another modification in which a slit 1*q* is formed near the through hole 1*n* in the frame portion 1*p* of the lead frame 1, in addition to the trench 1*h* communicating with the through hole 1*n*, and a second trench 1*r* communicating with both the slit 1*q* and the through hole 1*n* is formed.

Thus, since the trench 1*h* and the second trench 1*r* communicating with the slit 1*q* are formed in the lead frame 1, air which has entered the through hole 1*n* through the air vent 9*e* and trench 1*h* can be allowed to flow out from the through hole 1*n* through the second trench 1*r*, whereby the air present within each cavity 9*c* can be removed more easily. Moreover, it is easier for the sealing resin 7 to flow in the air vent 9*e*, and, hence, it is possible to diminish the formation of voids. Consequently, the sealing resin 7 can be surely injected not only into the cavity 9*c*, but also into the through hole 1*n*.

Like the trench 1*h*, the second trench 1*r* may be formed by half etching or stamping.

Figure 18:
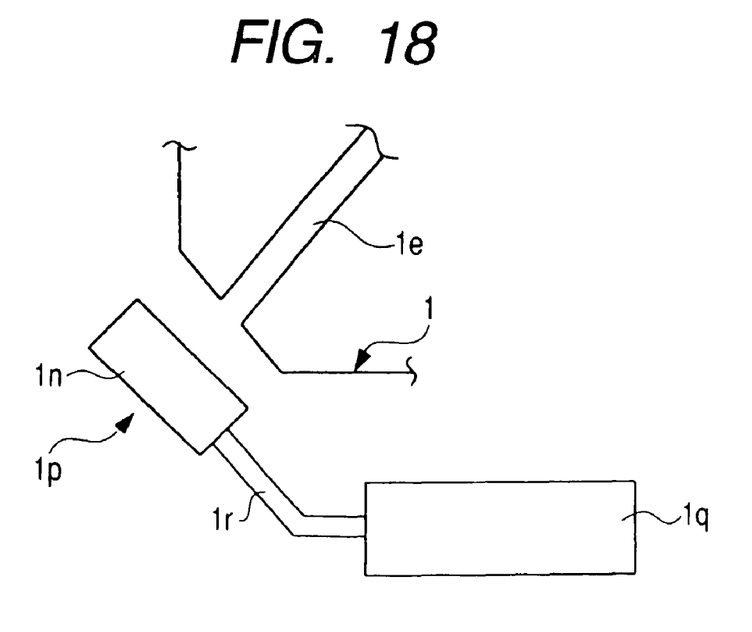
FIG. 18 is an enlarged plan view showing the structure of a corner portion of a device region in a lead frame according to a further modification of the embodiment.

FIG. 18 shows a further modification wherein a trench 1*h* such as shown in FIG. 17 is not formed. A through hole 1*n* and a slit 1*q* are formed in the frame portion 1*p*, and a second trench 1*r* which provides communication between the through hole 1*n* and the slit 1*q* is formed. In this case, air which has entered the through hole 1*n* is extruded toward only the slit 1*q* through the second trench 1*r*, whereby the sealing resin 7 can be injected sufficiently into the through hole 1*n*.

Although, in the above-described embodiments, the trenches 1*h* are formed on the back surface side opposite to the chip mounting side of the lead frame 1, the trenches 1*h* may be formed on the chip mounting side, or they may be formed on both the front surface (the chip mounting side) and the back surface (the side opposite to the chip mounting side). Forming the trenches on both the front surface and the back surface can be effected by forming them in positions which are deviated from each other to avoid overlapping.

Although the present invention has been described above on the basis of embodiments thereof, it goes without saying that the invention is not limited to the above-described embodiments, but that various changes may be made within a scope not departing from the gist of the invention.

For example, in the above-described embodiments, although reference has been made to a QFN 5 as an example of the semiconductor device, the semiconductor device may be of a type other than a QFN so long as it is assembled by using the lead frame 1 and by resin molding with use of a resin molding die.

In the above-described embodiments, although the injection of resin during resin molding is performed while covering the individual device regions 1*m* of the lead frame 1 with individual cavities 9*c* of a resin molding die 9, the injection of resin may be carried out in a state in which plural device regions 1*m* are covered all together with one cavity 9*c*.

The resin molding process adopted in the semiconductor device manufacturing method according to the above embodiments is also applicable to a case where a sealing sheet, such as the film sheet 8, is not used.

The present invention is suitable for use as a semiconductor device manufacturing technique.

What I claim is:

1. A lead frame in the shape of a thin plate used in a method of manufacturing a semiconductor device, comprising:

chip mounting portions capable of mounting semiconductor chips thereover;

suspending leads connected to the chip mounting portions;

a plurality of leads arranged around the chip mounting portions; and frame portions connected to the suspending leads and the leads, wherein the frame portions have through holes formed outside the suspending leads in extending directions of the suspending leads and also have trenches formed along the suspending leads on a back surface side opposite to the chip mounting portion side so as to communicate with the through holes.

2. The lead frame according to claim 1, wherein said lead frame is plated with palladium.

3. A lead frame in the shape of a thin plate used in a method of manufacturing a semiconductor device, comprising:

chip mounting portions capable of mounting semiconductor chips thereover;

suspending leads connected to the chip mounting portions;

a plurality of leads arranged around the chip mounting portions; and frame portions connected to the suspending leads and the leads, wherein the frame portions have through holes formed outside the suspending leads in extending directions of the suspending leads and also have trenches formed along the suspending leads on the same side as the chip mounting portion side so as to communicate with the through holes.

4. The lead frame according to claim 3, wherein said lead frame is plated with palladium.

5. A lead frame in the shape of a thin plate used in a method of manufacturing a semiconductor device, comprising:
   chip mounting portions capable of mounting semiconductor chips thereover;
   suspending leads connected to the chip mounting portions;
   a plurality of leads arranged around the chip mounting portions; and
   frame portions connected to the suspending leads and the leads,
   wherein the frame portions have through holes formed outside the suspending leads in extending directions of the suspending leads and also have trenches formed in both surfaces and back surfaces of the frame portions along the suspending leads and at mutually deviated positions to avoid overlapping and so as to communicate with the through holes.

6. The lead frame according to claim 5, wherein said lead frame is plated with palladium.

* * * * *